(12) United States Patent
Nakamura et al.

(10) Patent No.: US 6,755,957 B2
(45) Date of Patent: Jun. 29, 2004

(54) METHOD OF PLATING FOR FILLING VIA HOLES

(75) Inventors: Kenji Nakamura, Nagano (JP); Masao Nakazawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 394 days.

(21) Appl. No.: 09/772,457

(22) Filed: Jan. 30, 2001

(65) Prior Publication Data

US 2001/0013472 A1 Aug. 16, 2001

(30) Foreign Application Priority Data

Feb. 1, 2000 (JP) ........................................ 2000-023794
Nov. 1, 2000 (JP) ........................................ 2000-334044

(51) Int. Cl.⁷ ................................................. C25D 5/02
(52) U.S. Cl. ....................... 205/123; 205/125; 205/182; 205/183; 205/196; 205/205; 205/210; 205/220; 205/221; 205/223; 205/917
(58) Field of Search ................................. 205/103, 123, 205/125, 157, 182, 183, 196, 205, 210, 211, 215, 220, 221, 223, 917, 206

(56) References Cited

U.S. PATENT DOCUMENTS 2,830,014 A * 4/1958 Gundel et al. .............. 205/274
5,174,886 A 12/1992 King et al.
5,252,196 A 10/1993 Sonnenberg et al.
6,224,737 B1 * 5/2001 Tsai et al. ................... 205/123
6,534,116 B2 * 3/2003 Basol .......................... 427/97

FOREIGN PATENT DOCUMENTS

| EP | 0 949 855 A2 | 10/1999 |
| EP | 1 091 024 A1 | 4/2001 |
| JP | WO99/57342 | 11/1999 |
| JP | 2000-219994 | 8/2000 |

* cited by examiner

Primary Examiner—Roy King
Assistant Examiner—William T. Leader
(74) Attorney, Agent, or Firm—Paul & Paul

(57) ABSTRACT

A method of plating for filling via holes, in which each via hole is formed in an insulation layer covering a substrate so as to expose, at its bottom, part of a conductor layer located on the substrate. A copper film is formed on the top surface of the insulation layer covering the substrate, and the side walls and bottoms of the respective via holes. A strike plating of copper is provided on the copper film, and the substrate is immersed in an aqueous solution containing a plating promoter to thereby deposit the plating promoter on the surface of the copper strike. The plating promoter is removed from the copper strike plating located on the top surface insulation layer while leaving the plating promoter on the side walls and bottoms of the respective via holes. The substrate is subsequently electroplated with copper to fill the via holes.

7 Claims, 7 Drawing Sheets

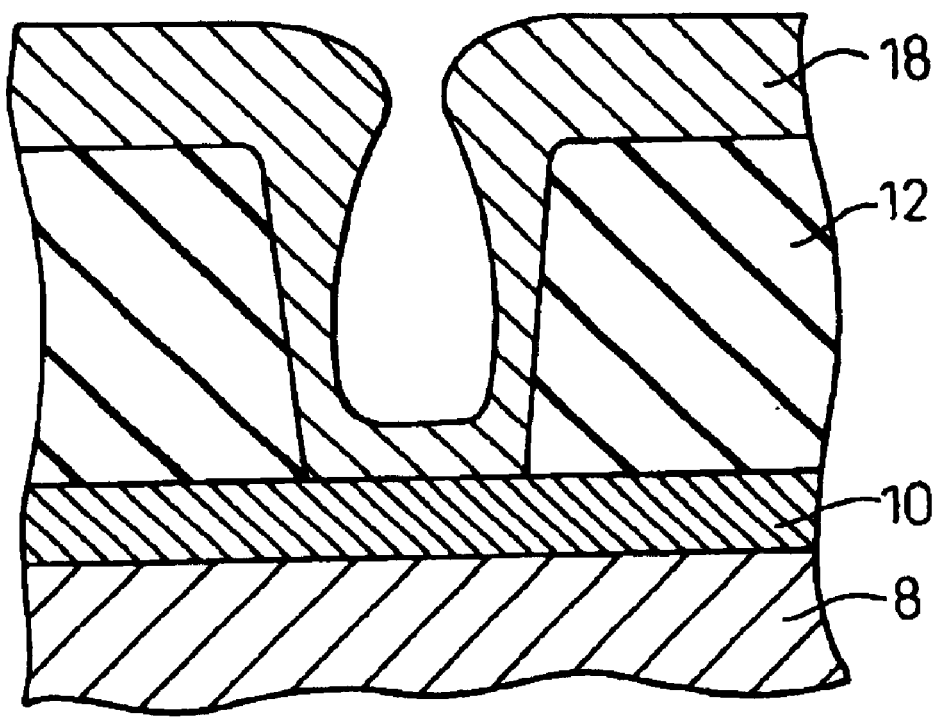

METHOD OF PLATING FOR FILLING VIA HOLES

BACKGROUND OF THE INVENTION

1. Field of the Invention

The invention relates to a method of plating for filling via holes in a multilayer circuit board.

2. Description of the Related Art

As a method of manufacturing a multilayer circuit board on which electronic devices, such as semiconductor chips, are mounted, a so-called build-up process is known.

A build-up process is described by referring to the drawings. In a build-up process, an insulation layer 12 is first formed on an underlying patterned wiring line 10 made up of copper or the like by the application or lamination of a material therefor (FIG. 13). A via hole 14 is then formed in the insulation layer 12 by laser machining or photolithography (FIG. 14). A copper plated layer 16 is subsequently formed so as to cover the inside of the via hole 14, where part of the patterned wiring line 10 is exposed at the bottom, and the top surface of the insulation layer 12, the copper plated layer 16 consisting of an electrolessly plated copper film 16a and an electroplated copper film 16b which are sequentially formed (FIG. 15). The copper plated layer 16 is then etched to provide an overlaying patterned wiring line 18 (FIG. 16). By the repetition of the above steps, a multilayer circuit board in which the lower wiring line 10 and the upper wiring line 18 are in electrical contact with each other through the plated films in the via hole 14, is produced.

When the insulation layer 12 is formed, the change in level on the surface of the formed insulation layer, which results from the underlying wiring line 10 having a top level higher than the surface of a substrate 8 on which the wiring line 10 is formed, can be cancelled by filling the inside of the via hole 14 with a conductor paste or insulating resin. However, such a process, which is also called a planarization process, increases the number of steps involved, and has a limited effect.

In the circumstances, a method of plating for via-filling in which the inside of a via hole is filled with copper plating has been proposed.

In the method of plating for via-filling, the inside of a via hole is designed to be filled with copper plating by, for example, contriving the agitation of a plating solution to thereby satisfactorily penetrate the inside of the via hole, or adding a plating promoting agent to thereby improve the throwing power of plating in the via hole.

However, filling via holes with copper plating has become difficult because patterned wiring lines have become more and more miniaturized and, accordingly, via holes are also miniaturized to have a large aspect ratio.

In particular, since a plating current tends to concentrate at a corner, there have been problems in that a large thickness of plating film is deposited at the edge of opening of the via hole to provide the via hole with a bottle neck, as illustrated in FIG. 17, and a plating solution is left in the via hole in the course of manufacturing a multilayer circuit board.

SUMMARY OF THE INVENTION

An object of the invention is to provide a method of plating for filling via holes in which even via holes having a small diameter and a large aspect ratio can be satisfactorily filled with copper plating.

The method of plating for filling via holes of the invention, in which each via hole formed in an insulation layer covering a substrate so as to expose, at its bottom, part of a conductor layer located on the substrate, is plated with copper to be filled with the plated metal, is characterized by comprising the steps of forming a copper film on the top surface of the insulation layer covering the substrate, and the side walls and bottoms of the respective via holes, immersing the substrate having the copper film formed in an aqueous solution containing a plating promoter to thereby deposit the plating promoter on the surface of the copper film, removing the plating promoter from the surface of the copper film located on the insulation layer and leaving the plating promoter on the side walls and bottoms of the respective via holes, and subsequently electroplating the substrate having the copper film formed with copper to thereby fill the via holes with the plated copper and simultaneously form a continuous copper film which eventually covers the via holes filled with the plated copper as well as the copper film previously formed on the insulation layer.

According to the above method, the plating promoter can be securely deposited within the via holes, and plating conditions in the via holes can be different from those on the top surface of the insulation layer. Also, a current for plating can be concentrated within the via holes, and even via holes having a large aspect ratio can be satisfactorily plated with copper.

As the plating promoter, a sulfur compound represented by the following general formula:

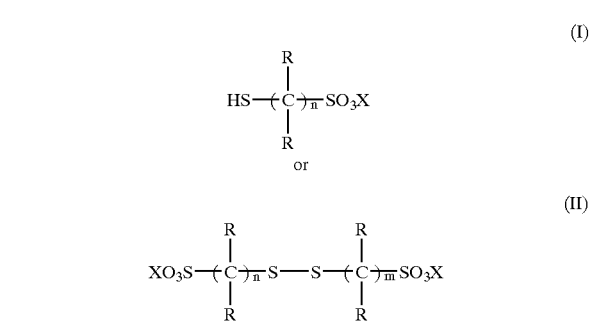

wherein x denotes sodium, potassium, or hydrogen, R denotes hydrogen or an alkyl group, n is an integer of one or larger, and m is an integer of one or larger, can be used. Preferably, the alkyl group denoted by R has one to six carbon atoms. Preferably, n is selected from the integers of one to six, and m is also selected from the integers of one to six. The sulfur compound may be used in an aqueous solution containing a non-ionic surfactant for improving wettability of the solution, such as a polyethylene glycol or polypropylene glycol.

Examples of the plating promoters represented by formula (I) include sodium 3-mercapto-1-propanesulfonate and sodium 2-mercaptoethanesulfonate, and examples of the plating promoters represented by formula (II) includes disodium bis-(3-sulfopropyl)-disulfide.

The step of removal of the plating promoter from the surface of the copper film located on the insulation layer can be carried out by, for example, an etching process using an etching solution for copper, a cyanide electrolytic treatment using a cyanide electrolytic bath, a ultraviolet radiation treatment obliquely irradiating the surface of the copper film on the insulation layer with ultraviolet radiation, or a treatment of polishing the surface of the copper film on the top of the insulation layer.

It is also possible that the step of removal of the plating promoter on the surface of the copper film located on the insulation layer is omitted and, after the step of immersion of the substrate in a plating promoter-containing solution, a reverse electrolytic treatment is performed at an early stage of the step of electroplating with copper.

It is also possible that the step of removal of the plating promoter on the surface of the copper film located on the insulation layer is omitted and, after the step of immersion of the substrate in a plating promoter-containing solution, a pulse plating in which the direction of current applied is periodically reversed is used in the step of electroplating with copper.

It is preferred that, in the step of electroplating with copper, an electroplating solution free of a plating promoter is used.

In addition, an electroplating solution free of a plating promoter may be used in the step of electroplating with copper, carrying out the step of immersion of the substrate using, as the plating promoter, sodium 3-mercapto-1-propanesulfonate or sodium 2-mercaptoethanesulfonate, and omitting the step of removal of the plating promoter on the surface of the insulation layer.

It is also preferred that, prior to the step of immersion of the substrate in a plating promoter-containing solution, a strike plating of copper is provided on the surface of the copper film.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein:

FIG. 17 is an illustration of a via hole having a bottle neck-like opening formed by a prior process.

DETAILED DESCRIPTION OF THE INVENTION

Figure 1:
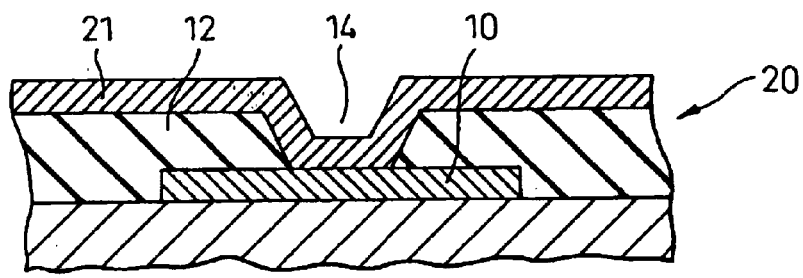
FIG. 1 illustrates the formation of a film of plated copper on an insulation layer having via holes.

Referring to FIG. 1, an insulation layer 12 is formed on a surface of a substrate on which patterned wiring lines 10 are provided, by applying or laminating an insulation material thereon, and it is then processed, by laser machining or photolithography, to provide via holes 14 which expose, at their bottom, part of the underlying wiring line. For example, an insulation layer is formed by heating and pressing a sheet of polyphenyleneether (PPE) for lamination and is machined by a YAG laser or carbon dioxide laser to form via holes.

Subsequently, a plated copper film 21 is formed so as to cover the top surface of the insulation layer 12 and the side wall and bottom of the via hole 14 by electroless plating. The plated copper film 21 may be formed by sputtering or evaporation in lieu of electroless plating.

Figure 2:
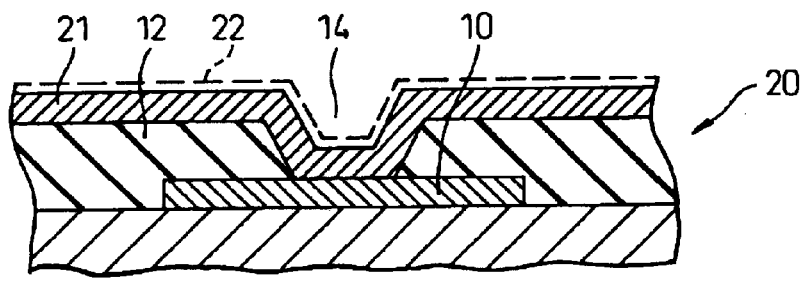
FIG. 2 illustrates the deposition of a layer of plating promoter on the film of plated copper.

The substrate 20 thus processed is then immersed in an aqueous solution containing a plating promoter, to thereby deposit the plating promoter and form a layer of plating promoter 22 on the plated copper film 21, as shown in FIG. 2. The formed layer of plating promoter is very thin, and is schematically represented by the broken line in FIG. 2 as well as the drawings subsequently referred to.

As the plating promoter, a sulfur compound can be used, the sulfur compound being represented by the general formula:

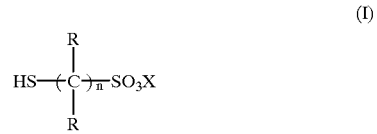

(I)

wherein x denotes sodium, potassium, or hydrogen, R denotes hydrogen or an alkyl group, and n is an integer of one or larger, such as sodium 3-mercapto-1-propanesulfonate or sodium 2-mercaptoethanesulfonate, or the general formula:

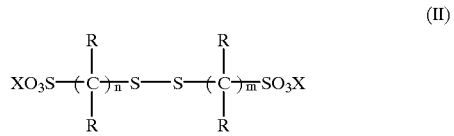

(II)

wherein X denotes sodium, potassium, or hydrogen, R denotes hydrogen or an alkyl group, n is an integer of one or larger, and m is an integer of one or larger, such as disodium bis-(3-sulfopropyl) disulfide. In the above formulae, it is preferred that the alkyl group denoted by R has one to six carbon atoms, such as methyl, ethyl, propyl, butyl, pentyl, and hexyl. It is also preferred that n is selected from the integers of one to six, and m is selected from the integers of one to six. If n and m are larger than six, the compound is oily and is expected to be indissoluble in an aqueous solution.

Such a plating promoter is one of additives which are added to a solution for copper plating, and is also known as a brightening agent or brightener. It is believed that when a plating promoter is deposited on the surface of an object to be plated, the resistance involved with plating is lowered, and a current for plating is concentrated so that plating is promoted.

The plating promoter in the invention is defined to be a sulfur compound which shifts a potential of a cathode relative to a potential of a reference electrode placed in a solution for copper plating toward the positive side when it is added to the copper plating solution as compared to the case of no addition thereof.

In the invention, a single plating promoter may be used, or a mixture of two or more plating promoters may be also used. An aqueous solution may contain the plating promoter in a concentration of several ppm to several percent, although the concentration of plating promoter is not limited to this range. In addition, the aqueous solution may contain an acidic ingredient, such as sulfuric acid or copper sulfate, for the inhibition of the generation of fungi.

The solution of plating promoter is used at a normal temperature. It is preferred that the substrate 20 having the plated copper film 21 is immersed in the solution of plating promoter for a relatively long time of the order of approximately 5 to 15 minutes so that the solution can satisfactorily penetrate into the via holes 14, although the time of immersion of the substrate 20 depends on the concentration of the solution of the plating promoter. It is also preferred that the solution of plating promoter is stirred, or the substrate 20 is rocked in the solution, for the acceleration of the penetration of solution. For the improvement of the wettability of the substrate 20 by a solution of plating promoter, it is preferred that the substrate 20 is previously immersed in a pretreatment solution, such as a solution of a surfactant or the like. After the immersion, the substrate 20 is washed by water in an appropriate manner. The plating promoter deposited to the substrate is not removed even after water washing.

Figure 3:
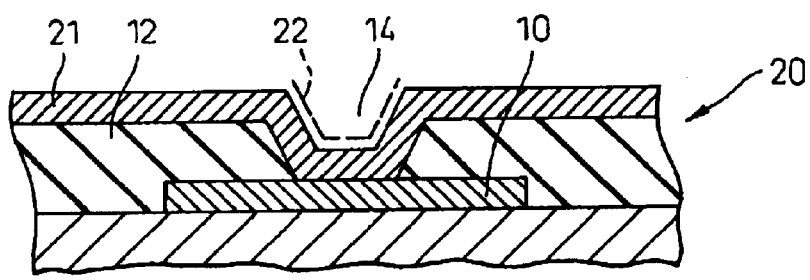
FIG. 3 illustrates the selective removal of the deposited plating promoter from the top of the film of plated copper located over the insulation layer to leave the plating promoter within the via hole.

As shown in FIG. 3, the deposited plating promoter is then removed from the surface of the copper film 21 located on the insulation layer 12, and is left on the side wall and bottom of the via hole 14. The removal of the plating promoter can be achieved by immersing the substrate 20 in a solution for etching copper, such as an aqueous solution of ferrous chloride. It is preferred that after the immersion of the substrate 20 in this etching solution, the substrate is immediately water-washed. When the substrate 20 is immersed in a copper etching solution for a short time, the etching solution will not penetrate into the via holes 14 and, accordingly, the plating promoter on the surface of the copper film 21 located on the insulation layer 12, and except for the plating promoter inside the via hole 14, can be selectively removed.

The step of removal of the plating promoter can be also carried out by a cyanide electrolytic treatment using a cyanide electrolytic bath. Alternatively, the plating promoter may be removed by the decomposition thereof by a ultraviolet radiation treatment obliquely irradiating the surface of the copper film 21 on the insulation layer 12 with ultraviolet radiation. In this case, the oblique irradiation will not fully go into the via holes 14 and, accordingly, the plating promoter deposited on a portion other than the areas where the via holes are located of the copper film 21 can be selectively removed. Alternatively, the plating promoter on the surface of the copper film 21 located on the insulation layer 12 can also be selectively removed by a treatment of polishing that surface of the copper film 21 on the insulation layer 12.

Figure 4:
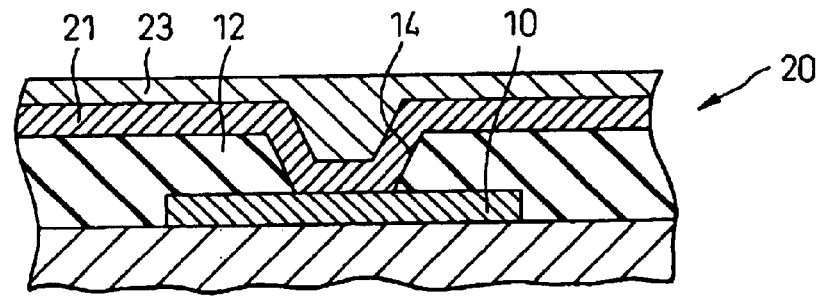
FIG. 4 illustrates the simultaneous filling of the via holes and formation of a continuous conductor layer by the use of electroplating with copper.

Subsequently to the step of selective removal of the plating promoter on the surface of the copper film 21 located on the insulation layer 12, the substrate 20 is subjected to an electroplating process so as to deposit copper on the surface of the insulation layer 12, which has been exposed in the step of selective removal of the plating promoter thereon, and on the layer of plating promoter 22 left in the via holes 14, to thereby fill the via holes 14 with plated copper. After the electroplating of copper, as illustrated in FIG. 4, the substrate 20 has a continuous layer of copper 23 which completely covers the surface thereof provided with the wiring lines 10, insulation layer 12, and the via holes 14.

An example of solutions for the copper plating is as follows:

| copper sulfate | 120 g/L |
|---|---|
| sulfuric acid | 190 g/L |
| chloride ion | 50 ppm |
| additive | 40 mL/L |

Examples of the additives are as follows:

| PEG4000 (polyethylene glycol) | 180 g/L |
|---|---|
| PPG425 (polypropylene glycol) | 72 g/L |

It is preferred that such a polymer component is used as an additive because its capability of improving the wettability of the plating solution.

It is noted that the above solution for copper plating does not contain a plating promoter. It is preferred that the plating solution is free of a plating promoter for the stability of the plating solution and in the case of the omission of the step of removal of the plating promoter described above, although it may contain a plating promoter in such a case where electroplating the copper film 21 with copper to make the layer 23 as illustrated in FIG. 4 is achieved using periodic pulse reverse (PPR) of plating current.

It should also be noted that the composition of the copper plating solution is not limited to the example referred to above.

Figure 6:
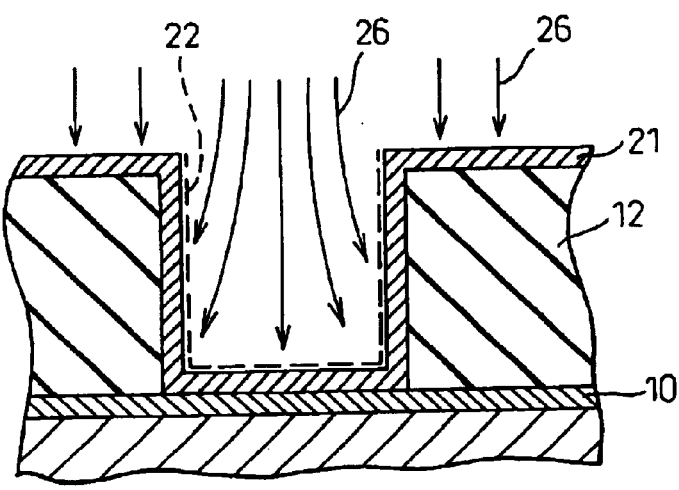
FIG. 6 illustrates the concentration of plating current in the via hole.

By electroplating the copper film 21 with copper after the selective removal of the plating promoter deposited on the copper film 21 located on the insulation layer 12, a current 26 for plating is concentrated in the via hole 14 in which the layer of plating promoter 22 is retained, as illustrated in FIG. 6, and the via hole 14 can be completely filled with the electroplated copper 23, as shown in FIG. 4.

Figure 5:
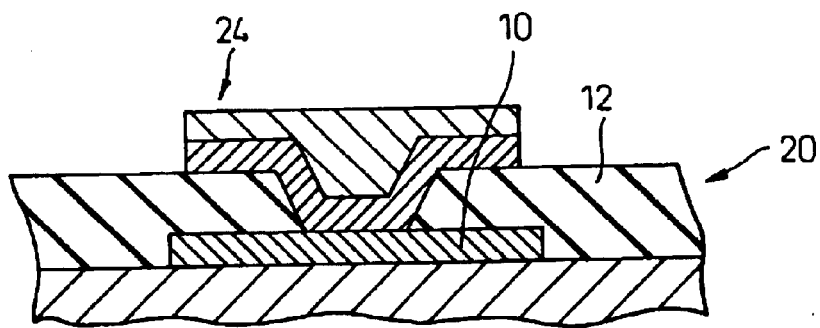
FIG. 5 illustrates the formation of patterned wiring lines.

The layer of electroplated copper 23 and the underlying copper film 21 are then patterned by etching, to thereby form upper wiring lines 24, as shown in FIG. 5.

By the repetition of the above steps, a multilayer circuit board in which the lower wiring line 10 and the upper wiring line 24 are in electrical contact with each other through the copper filled in the via hole 14, can be obtained.

Figure 12:
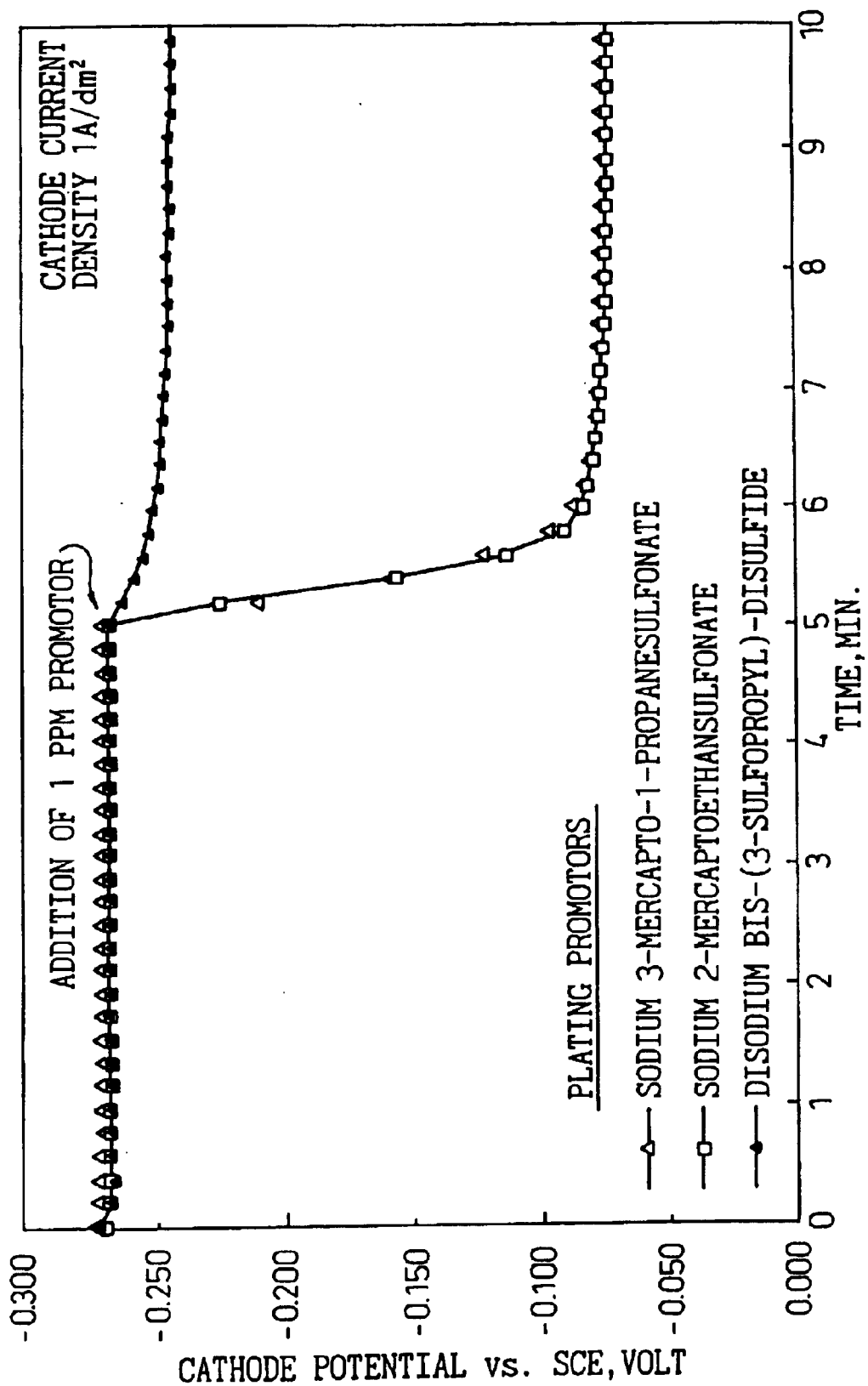
FIG. 12 shows characteristics of different plating promoters.
Figure 13:
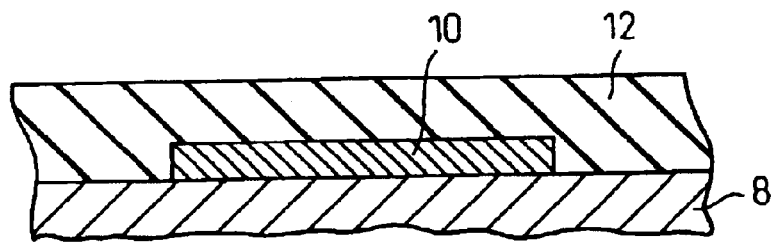
FIG. 13 illustrates the formation of an insulation layer in a build-up process.
Figure 14:
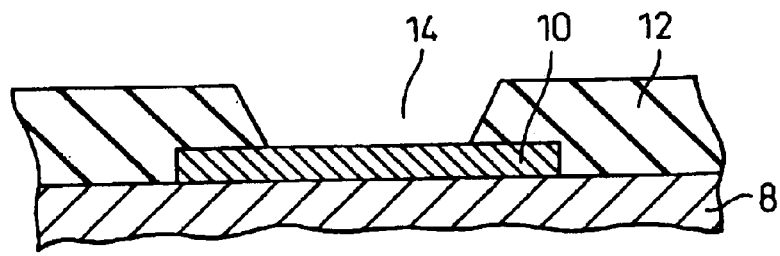
FIG. 14 illustrates the formation of a via hole.
Figure 15:
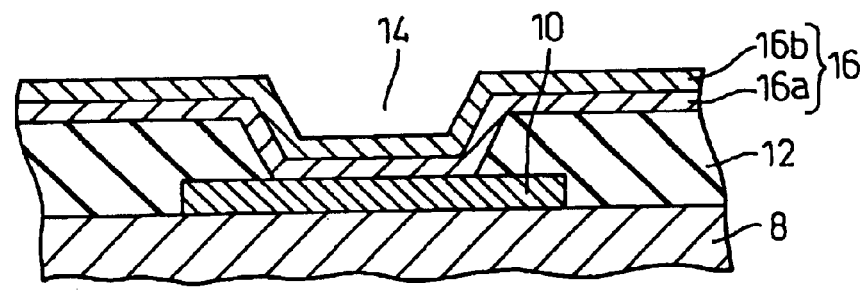
FIG. 15 illustrates the formation of a copper layer by successive electroless plating and electroplating.
Figure 16:
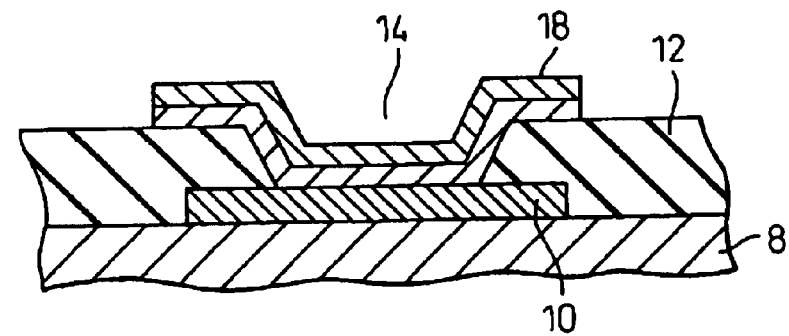
FIG. 16 illustrates the patterning of the copper layer.

Characteristics of different plating promoters are shown in FIG. 12. The curves indicated in FIG. 12 were obtained by detecting a potential of a cathode relative to a potential of a reference electrode placed in the plating solution described above while electroplating a substrate with copper using the plating solution, which contained no plating promoter, for 5 minutes, and subsequently using the plating solution to which a plating promoter was added in a concentration of 1 part per million (ppm). As the plating promoters, sodium 3-mercapto-1-propanesulfonate, sodium 2-mercaptoethanesulfonate, and disodium bis-(3-sulfopropyl) disulfide were used. In all plating solutions, the cathode potential after the addition of the plating promoter was shifted toward the positive side as compared to the solution before the addition thereof, which means that the solution containing the plating promoter makes it easy to deposit copper on a substrate at a lower voltage than that required in the case of a plating solution containing no plating promoter.

As earlier described, although it is preferred to use a plating solution containing no plating promoter so as to effectively concentrate a current for plating in the via hole 14, a solution for electroplating with copper containing a plating promoter may be used. Even in this case, since the plating promoter is already deposited in the vial holes 14 in the previous step as described above, the current can be concentrated in the via hole 14, and the via holes can be filled with the plated copper.

In lieu of the step of selective removal of the plating promoter deposited on the copper film 21 located on the insulation layer 12, a reverse electrolytic treatment may be performed at an early stage of the step of electroplating with copper. For example, a few minutes after the initiation of the electroplating with copper, copper-plating is carried out for a few minutes while reversing the polarities of electrodes (anode and cathode) at, for instance, 30 second intervals. On the reversal of the polarities of the electrodes, the removal of the plating promoter deposited on portion outside the via holes 14 is accelerated and, accordingly, the current for plating can be concentrated in the via holes 14, to thereby completely fill the via holes 14 with the plated copper.

Alternatively, in lieu of the step of selective removal of the plating promoter deposited on the copper film 21 located on the insulation layer 12, a pulse plating in which the direction of current applied is periodically reversed is used in the step of electroplating with copper. For example, by pulse plating (PPR electroplating) in which a current (plating current) is applied in the normal direction for 10 microseconds and a current in the reverse direction is applied for 1 microsecond, the plating promoter deposited on portion outside the via holes 14 is removed and, accordingly, the via holes 14 can be completely filled with the plated copper.

Alternatively, the via holes 14 can also be filled with plated copper only by the use of a solution for copper plating free of a plating promoter in the step of electroplating with copper, with the step of selective removal of the plating promoter deposited on the copper film 21 located on the insulation layer 12 being omitted. Also in this case, since the plating promoter is already deposited in the vial holes 14 in the previous step as described above, the current for plating can be concentrated in the via hole 14 so as to completely fill the via holes with the plated copper.

It is further preferred that an additional plating step, which forms, by electroplating, a strike plating film of copper on the film 21 of electrolessly plated copper, is interposed between the step of electroless plating and the step of immersion of the substrate in the solution containing the plating promoter. Since a film of pure copper is formed on the film 21 of electrolessly plated copper by this additional step, failure of the deposition of the plating promoter due to, for instance, the oxidation of the surface of the film 21 of electrolessly plated copper can be prevented, and the plating promoter can be deposited evenly and uniformly on the clean surface of copper so as to completely fill the via holes 14 with the subsequently plated copper.

EXAMPLES

The invention will now be described referring to the following examples; however, the invention is not limited to the examples.

Example 1

The surface of a silicon substrate provided with an insulation layer having via holes formed so as to expose, at their bottoms, part of the underlying conductor layer was electroless-plated with copper. The substrate was then immersed in an aqueous solution of 1% sodium 3-mercapto-1-propanesulfonate (plating promoter) for 15 minutes with rocking, to thereby deposit the plating promoter on the film of the electroless-plated copper.

After water washing, the substrate was placed in a cyanide electrolytic bath (20 g/L NaCN and 140 g/L NaOH), and was electrolytically treated at a normal temperature and at an applied voltage of 1.4 volts for 30 seconds, with the substrate being used as a cathode, to thereby remove the plating promoter on the film of the electroless-plated copper located on the insulation layer and leave the plating promoter within the via holes.

Figure 7:
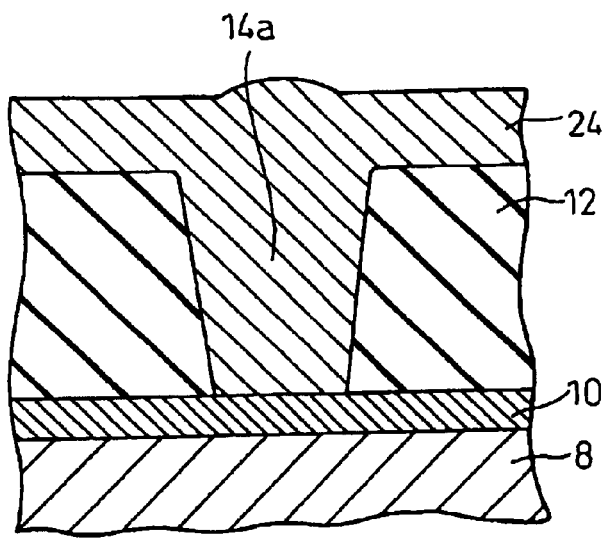
FIG. 7 is an illustration of one of the results obtained in Example 1.
Figure 8:
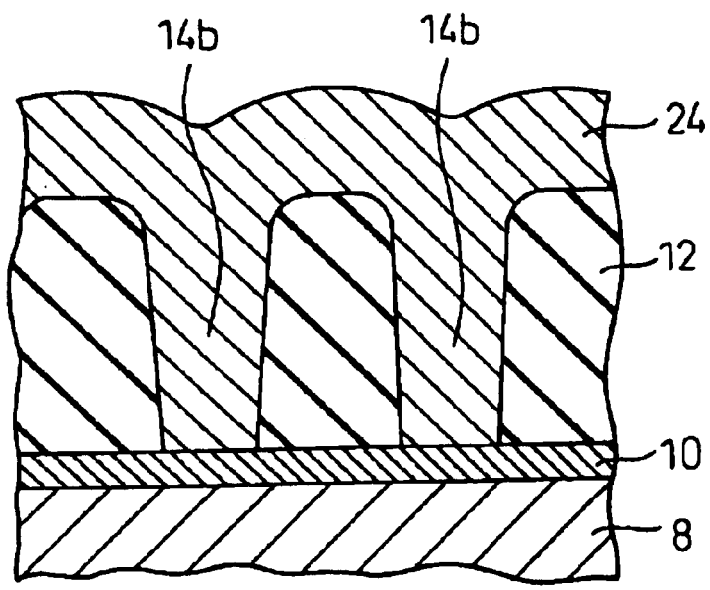
FIG. 8 is an illustration of another result obtained in Example 1.

After the water washing, the substrate was electroplated with copper using a plating bath containing the following ingredients:

| | |
|---|---|
| copper sulfate | 120 g/L |
| sulfuric acid | 190 g/L |
| chloride ion | 50 ppm |
| PEG4000 (180 g/L solution) | 40 mL/L | at a normal temperature and a current density of 1 $A/dm^2$ for 100 minutes. As a result, the via holes were completely filled with the plated copper, as shown in FIGS. 7 and 8 which respectively illustrate a via hole 14a having a diameter at its opening of 46 micrometers, a depth of 53 micrometers, and an aspect ratio of 1.15, and a via hole 14b having a diameter at its opening of 28 micrometers, a depth of 53 micrometers, and an aspect ratio of 1.89.

The same results were obtained when sodium 2-mercaptoethanesulfonate or disodium bis-(3-sulfopropyl) disulfide was used as a plating promoter, in lieu of sodium 3-mercapto-1-propanesulfonate. Also, the same results were obtained when mixtures of these plating promoters were used.

Example 2

The surface of a silicon substrate provided with an insulation layer having via holes formed so as to expose, at their bottoms, part of the underlying conductor layer was electroless-plated with copper. The substrate was then immersed in an aqueous solution containing 1.5 g/L of sodium 3-mercapto-1-propanesulfonate (plating promoter) for 3 minutes, to thereby deposit the plating promoter on the film of the electroless-plated copper.

After water washing, the substrate was electroplated with copper using the plating bath used in Example 1 at a normal temperature and a current density of 1 $A/dm^2$ for 100 minutes. In the course of the electroplating, the polarities of electrodes (anode and cathode) were reversed at 30 second interval from 2 minutes to 9 minutes after the initiation of the plating.

Figure 9:
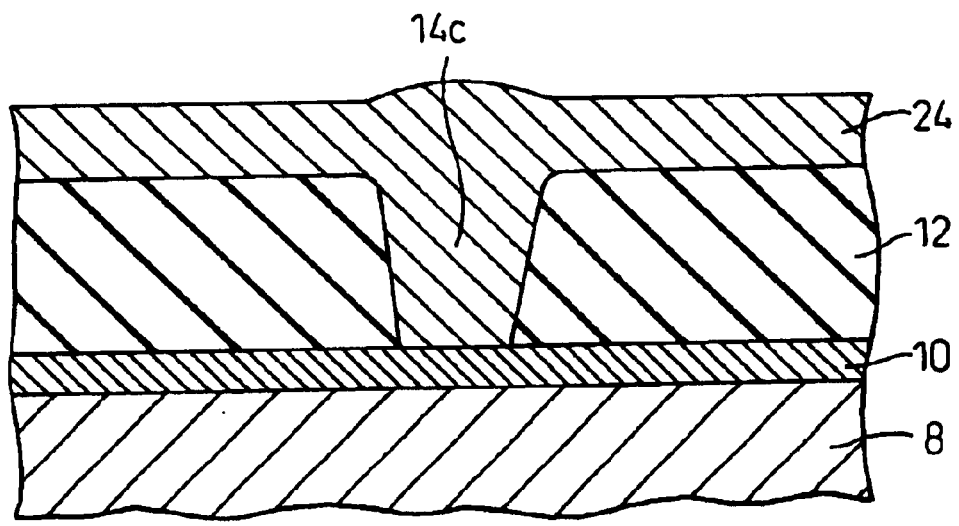
FIG. 9 is an illustration of one of the results obtained in Example 2.
Figure 10:
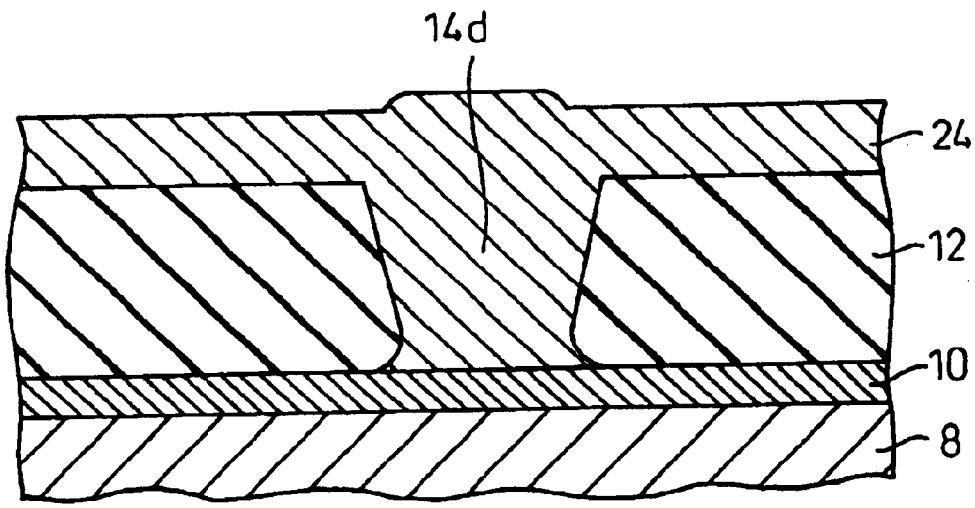
FIG. 10 is an illustration of another result obtained in Example 2.

As a result, the via holes were completely filled with the plated copper, as shown in FIGS. 9 and 10, which respectively illustrate a via hole 14c having a diameter at its opening of 40 micrometers and an aspect ratio of about 0.5, and a via hole 14d having a diameter at its opening of 60 micrometers and an aspect ratio of about 0.5.

The same results were obtained when sodium 2-mercaptoethanesulfonate or disodium bis-(3-sulfopropyl)

disulfide was used, as a plating promoter, in lieu of sodium 3-mercapto-1-propanesulfonate. Also, the same results were obtained when mixtures of these plating promoters were used.

Example 3

The surface of a silicon substrate provided with an insulation layer having via holes formed so as to expose, at their bottoms, part of the underlying conductor layer was electroless-plated with copper. The substrate was then immersed in an aqueous solution of 1% sodium 3-mercapto-1-propanesulfonate (plating promoter) for 10 minutes with rocking, to thereby deposit the plating promoter on the film of the electroless-plated copper.

After water washing, the substrate was PPR-electroless-plated with copper using the plating bath used in Example 1 at the following conditions:

| | |
|---|---|
| time of current applied in normal direction | 10 ms |
| time of current applied in reverse direction | 0.5 ms |
| current density in normal direction | 1 A/dm$^2$ |
| current density in reverse direction | 3 A/dm$^2$ |
| time of plating | 100 minutes |

Figure 11:
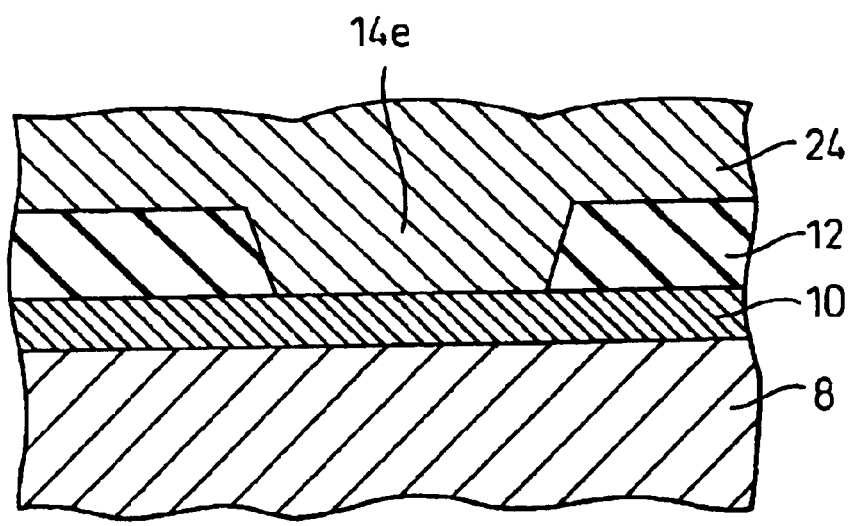
FIG. 11 is an illustration of one of the results obtained in Example 3.

As a result, the via holes 14e having a diameter at its opening of 100 micrometers and a depth of 30 micrometers could be completely filled with the plated copper, as shown in FIG. 11.

The same results were obtained when sodium 2-mercaptoethanesulfonate or disodium bis-(3-sulfopropyl) disulfide was used as a plating promoter, in lieu of sodium 3-mercapto-1-propanesulfonate. Also, the same results were obtained when mixtures of these plating promoters were used.

As described, according to the invention, even a via hole having a large aspect ratio, such as of 0.5 to 2, can be satisfactorily filled with a plated metal.

What is claimed is:

1. A method of plating for filling via holes, in which each of via holes formed in an insulation layer covering a substrate so as to expose, at its bottom, part of a conductor layer located on the substrate, is plated with copper to fill the via holes with plated copper, the method comprising the steps of:

forming a copper film on the top surface of the insulation layer covering the substrate, and the side walls and bottoms of the respective via holes, forming a strike plating of copper on the surface of the copper film, immersing the substrate having the copper film and copper strike plating formed thereon in an aqueous solution containing a plating promoter to thereby deposit the plating promoter on the surface of the copper strike plating, removing the plating promoter from the surface of the copper strike plating located on the ton surface of the insulation layer and leaving the plating promoter on the side walls and bottoms of the respective via holes, and electroplating the substrate having the copper film and copper strike plating with copper to thereby fill the via holes with the plated copper and simultaneously form a continuous copper film which eventually covers the via holes filled with the plated copper as well as the copper strike plating previously formed on the top surface of the insulation layer.

2. The method of claim 1, wherein, as the plating promoter, a sulfur compound or a mixtures of sulfur compounds is used, the sulfur compound being selected from the group consisting of the compounds represented by the general formulae:

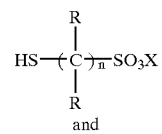

and

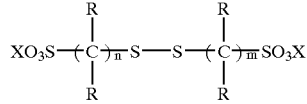

wherein X denotes sodium, potassium, or hydrogen, R denotes hydrogen or an alkyl group, n is an integer of one or larger, and m is an integer of one or larger.

3. The method of claim 2, wherein the sulfur compound is selected from the group consisting of sodium 3-mercapto-1-propanesulfonate, sodium 2-mercaptoethanesulfonate, and disodium bis-(3-sulfopropyl)-disulfide.

4. The method of claim 1, wherein the aqueous solution containing the plating promoter further comprises a non-ionic surfactant.

5. The method of claim 4, wherein the non-ionic surfactant is a polyethylene glycol or polypropylene glycol.

6. The method of claim 1, wherein the plating promoter is removed by a process or treatment selected from the group consisting of (1) an etching process using an etching solution for copper, (2) a cyanide electrolytic treatment using a cyanide electrolytic bath, (3) an ultraviolet radiation treatment obliquely irradiating the surface of the copper strike plating on the insulation layer with ultraviolet radiation, and (4) a treatment of polishing the surface of the copper strike plating on the top of the insulation layer.

7. The method of claim 1, wherein the step of electroplating with copper is carried out by the use of an electroplating solution free of a plating promoter.

* * * * *